(12) United States Patent
Kim

(10) Patent No.: US 6,500,718 B2
(45) Date of Patent: Dec. 31, 2002

(54) METHOD FOR FABRICATING SEMICONDUCTOR DEVICE

(75) Inventor: Jae Kap Kim, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 5 days.

(21) Appl. No.: 09/747,621

(22) Filed: Dec. 22, 2000

(65) Prior Publication Data

US 2001/0005616 A1 Jun. 28, 2001

(30) Foreign Application Priority Data

Dec. 23, 1999 (KR) ............................................. 99-61040

(51) Int. Cl.[7] .................. H01L 21/336; H01L 21/3205; H01L 21/4763; H01L 21/44
(52) U.S. Cl. ...................... 438/296; 438/301; 438/586; 438/670
(58) Field of Search ................................. 438/301, 586, 438/296, 674, 672

(56) References Cited

U.S. PATENT DOCUMENTS

| | | | |
|---|---|---|---|
| 4,737,828 A | * | 4/1988 | Brown |
| 5,571,738 A | * | 11/1996 | Krivokapic |
| 5,591,670 A | | 1/1997 | Park et al. |
| 5,955,768 A | | 9/1999 | Liaw et al. |
| 5,960,270 A | | 9/1999 | Misra et al. |
| 6,046,088 A | * | 4/2000 | Klein et al. |
| 6,072,221 A | | 6/2000 | Hieda |
| 6,080,654 A | | 6/2000 | Manchester |
| 6,104,052 A | | 8/2000 | Ozaki et al. |

* cited by examiner

*Primary Examiner*—John F. Niebling
*Assistant Examiner*—Ron Pompey
(74) *Attorney, Agent, or Firm*—Timothy J. Keefer; Wildman, Harrold, Allen & Dixon

(57) ABSTRACT

An method for fabricating a semiconductor device reduces a size of a MOSFET by self aligning a gate electrode with a device isolation insulation film. Thus, the gate electrode is not overlapped with the device isolation insulation film, differently from a conventional method for forming a MOSFET by partially overlapping the gate electrode with the device isolation insulation film in consideration of misalignment and CD variations in a mask process. As a result, a size of the MOSFET is reduced, thereby efficiently achieving the high integration of the semiconductor device.

4 Claims, 13 Drawing Sheets

METHOD FOR FABRICATING SEMICONDUCTOR DEVICE

CROSS REFERENCE TO THE RELATED APPLICATION

This application claims the priority of Korean patent application Serial No. 99-61040 file on Dec. 23, 1999.

BACKGROUND OF THE INVENTION

1. Field of the Invention

The present invention relates to a method for fabricating a semiconductor device, and in particular to an improved method for fabricating a semiconductor device which can form a high integration MOSFET consisting of a gate electrode and source/drain regions.

2. Description of the Background Art

Recently, researches have been actively performed to miniaturize and functionalize a semiconductor device which has been widely employed for appliances, office devices and industrial systems.

It is essential to highly integrate a MISFET used as a unit constitutional element of the semiconductor device in order to achieve the miniaturization and functionalization of the semiconductor device.

A size of the MOSFET is dependent upon a critical dimension (CD) allowable error considering a minimum size of each pattern and pattern size variations in a mask process, and a misalignment allowable error considering misalignment between the patterns in the mask process.

On the other hand, in a conventional method for fabricating a semiconductor device, a gate electrode is partially overlapped with a device isolation insulation film, by considering the misalignment and CD variation in the mask process.

The conventional method for fabricating the semiconductor device will now be described with reference to FIG. 1.

FIG. 1 is a plan view illustrating major mask layers used to fabricate the semiconductor device.

As illustrated in FIG. 1, a gate electrode mask 104 is partially overlapped with a device isolation insulation film mask 102. Reference numeral 106 denotes a contact mask.

Here, an interval between adjacent MOSFETs corresponds to a sum of a minimum interval between the gate electrodes and an overlapped interval between the gate electrode and the device isolation insulation film.

For example, when the conventional method employs a design rule of 0.18 µm, the minimum interval between the gate electrodes is 0.18 µm.

In addition, the overlapped interval between the gate electrode and the device isolation insulation film is about 0.06 µm when considering the misalignment and CD variation. Accordingly, the interval between the adjacent MOSFETs is a sum of the minimum interval between the gate electrodes and the overlapped interval between the gate electrode and the device isolation insulation film at both MOSFETs (0.18 µm +0.6 µm*2=0.30 µm).

As described above, the conventional method for fabricating the semiconductor device has a disadvantage in that the overlapped interval between the gate electrode and the device isolation insulation film (0.06 µm) is added to the both MOSFETs by considering the misalignment and CD variation in the mask process, and thus the size of the MOSFET is increased. As a result, it impedes the high integration of the MOSFET.

SUMMARY OF THE INVENTION

Accordingly, an object of the present invention is to provide a method for fabricating a semiconductor device which can achieve high integration of the semiconductor device by reducing a size of a MOSFET.

In order to achieve the above-described object of the present invention, a method for fabricating a semiconductor device includes the steps of: forming a device isolation insulation material, by forming a trench mask layer on a semiconductor substrate, forming a trench by partially etching the trench mask layer and the semiconductor substrate by employing a device isolation mask having a predetermined pattern, and filling up the trench; forming a device isolation insulation film on the trench, by exposing the upper portion of the trench mask layer by removing the device isolation insulation material according to an etch back process, forming a groove by removing a part of the device isolation insulation material in a presumed field region of a gate electrode line, and exposing a part of the semiconductor substrate by removing the trench mask layer; forming a gate insulation film on the exposed semiconductor substrate, and forming a conductive material for a gate electrode to fill up a stepped portion of the device isolation insulation film; and forming a gate electrode self aligned with the device isolation insulation film, by exposing the upper portion of the device isolation insulation film by removing the conductive material for the gate electrode according to an etch back process, and removing a part of the conductive material for the gate electrode according to an etching process using a gate electrode mask.

There is also provided a method for fabricating a semiconductor device, including the steps of: forming a device isolation insulation material, by sequentially forming a gate insulation material and a conductive material for a first gate electrode on a semiconductor substrate, forming a trench by partially etching the conductive material for the first gate electrode, the gate insulation material and the semiconductor substrate by employing a device isolation mask having a predetermined pattern, and filling up the trench; forming a groove, by exposing the upper portion of the conductive material for the first gate electrode by removing the device isolation insulation material according to an etch back process, and removing a part of the device isolation insulation material in a presumed field region of a gate electrode line; forming a conductive material for a gate electrode, by forming a conductive material for a second gate electrode to fill up the groove, and exposing the upper portions of the device isolation insulation material and the conductive material for the first gate electrode by removing the conductive material for the second gate electrode according to an etch back process; and forming a gate electrode self aligned with the device isolation insulation film, by removing a part of the conductive material for the gate electrode according to an etching process using a gate electrode mask having a predetermined pattern.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a semiconductor device in accordance with the present invention will now be described in detail with reference to the accompanying drawings.

Figure 1:
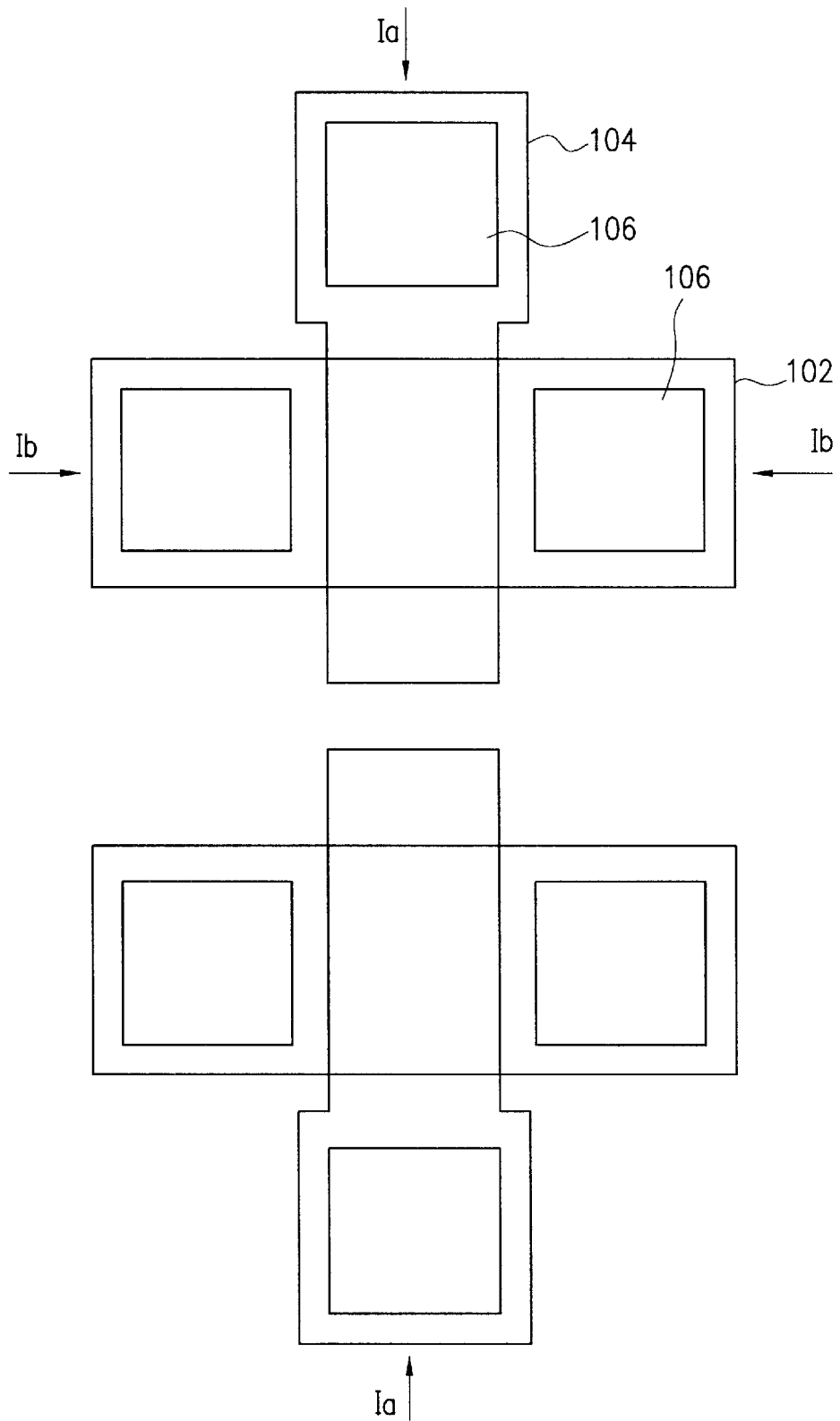
FIG. 1 is a plan view illustrating major mask layers used to fabricate a conventional semiconductor device.
Figure 2:
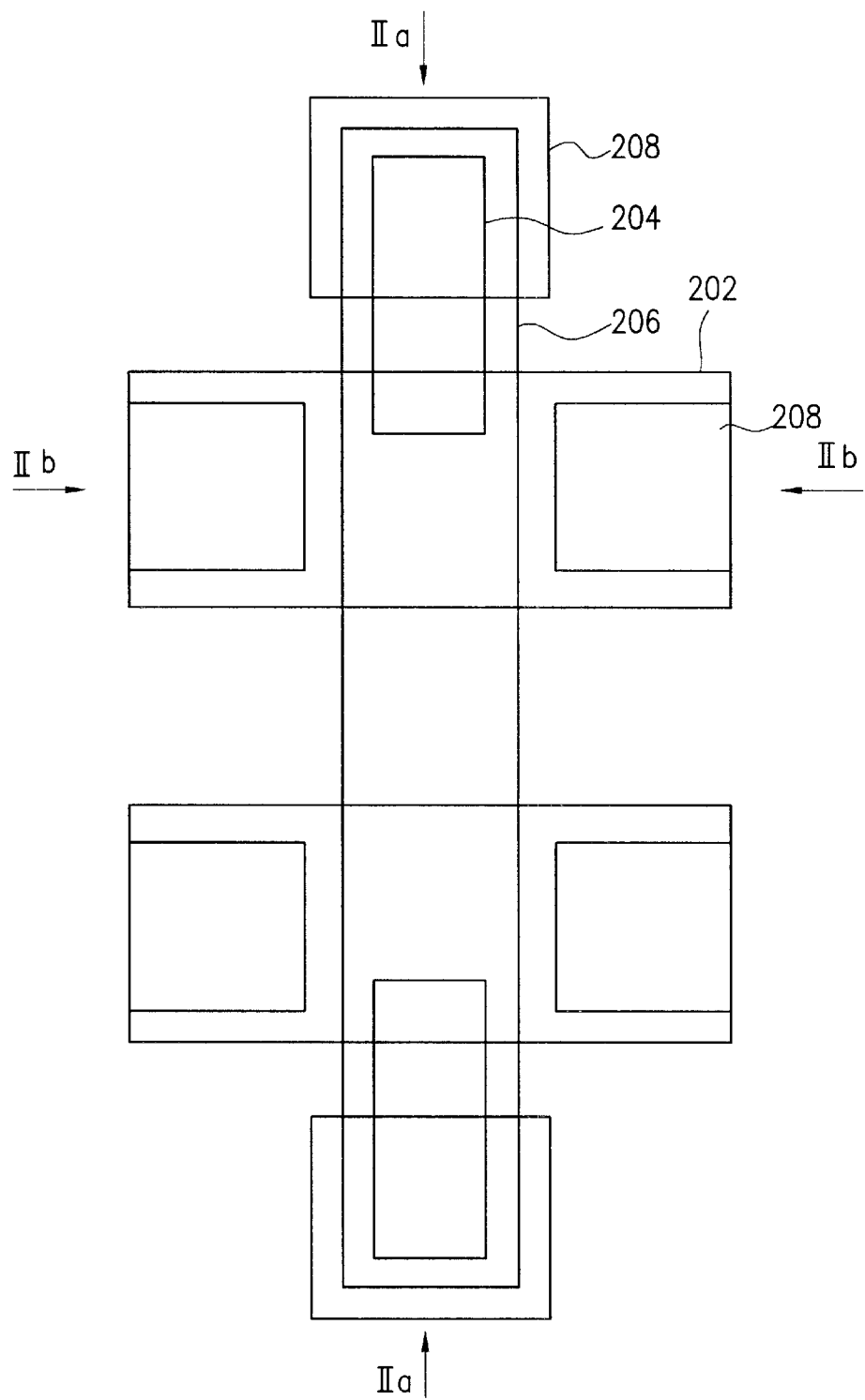
FIG. 2 is a plan view illustrating major mask layers used to fabricate a semiconductor device in accordance with the present invention.

FIG. 2 is a plan view illustrating major mask layers used to fabricate the semiconductor device in accordance with the present invention.

As illustrated in FIG. 2, a gate electrode is self aligned with a device isolation insulation film, thereby preventing the gate electrode from being overlapped with the device isolation insulation film.

Here, reference numeral 202 denotes a device isolation insulation film mask, 204 denotes a gate formation mask, 206 denotes a gate electrode mask, and 208 denotes a contact mask. The gate electrode mask 206 is used to pattern a conductive material for the gate electrode formed in an active region.

Accordingly, an interval between adjacent MOSFETs corresponds to a minimum interval between the device isolation insulation films.

The method for fabricating the semiconductor device by using the above-described mask layers will now be described with reference to the accompanying drawings.

FIGS. 3a to 3f are schematic cross-sectional views illustrating sequential steps of the method for fabricating the semiconductor device in accordance with a first embodiment of the present invention. Here, Figures at the left sides are cross-sectional views taken along line IIa—IIa in FIG. 2, and Figures at the right sides are cross-sectional views taken along line IIb—IIb in FIG. 2.

Figure 3A:
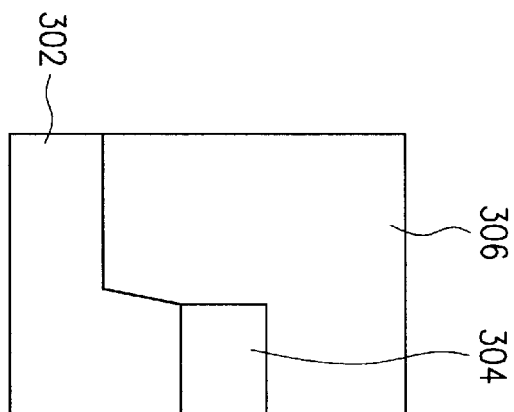
FIGS. 3a to 3f are schematic cross-sectional views illustrating sequential steps of a method for fabricating a semiconductor device in accordance with a first embodiment of the present invention, taken along lines IIa—IIa and IIb—IIb in FIG. 2 from the left side.
Figure 3A:
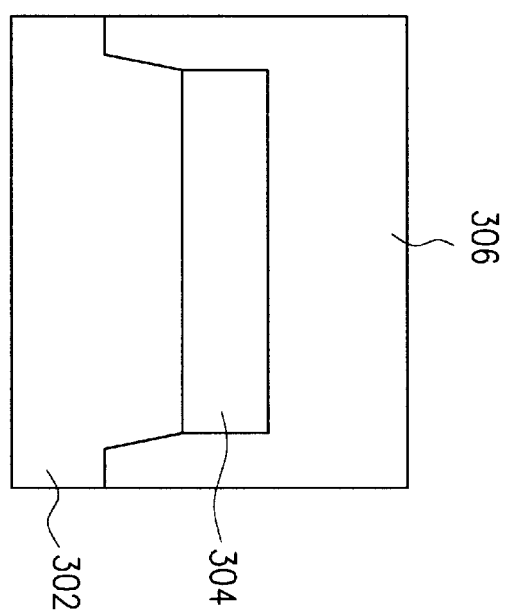

As shown in FIG. 3a, an oxide film and a nitride film or an oxide film and a silicon film are sequentially stacked on a semiconductor substrate 302, thereby forming a trench mask layer 304.

Thereafter, the trench mask layer 304 and the semiconductor substrate 302 are partially etched according to an etching process using the device isolation mask 202 as shown in FIG. 2, thereby forming a trench (for forming a device isolation insulation film).

A device isolation insulation material 306 for forming the device isolation insulation film in a succeeding process is formed to completely fill up the trench on the semiconductor substrate 302.

Preferably, the device isolation insulation material 306 consists of an oxide film.

In addition, the upper portion of the trench mask layer 304 is exposed by partially removing the upper portion of the device isolation insulation material 306 according to an etch back process.

The device isolation insulation material 306 in a presumed field region of a gate electrode line is etched by a predetermined thickness according to an etching process using the gate formation mask 204 as shown in FIG. 2, thereby forming a groove.

Figure 3B:
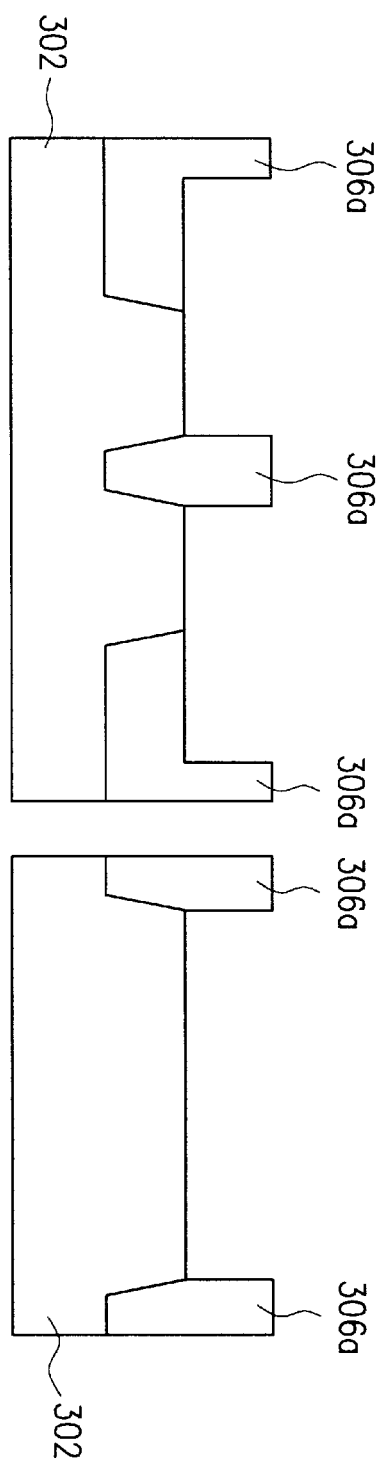

As depicted in FIG. 3b, the upper portion of the semiconductor substrate 302 is partially exposed by removing the residual trench mask layer 304 on the semiconductor substrate 302, thereby forming a device isolation insulation film 306a in a trench region of the semiconductor substrate 302.

Figure 3C:
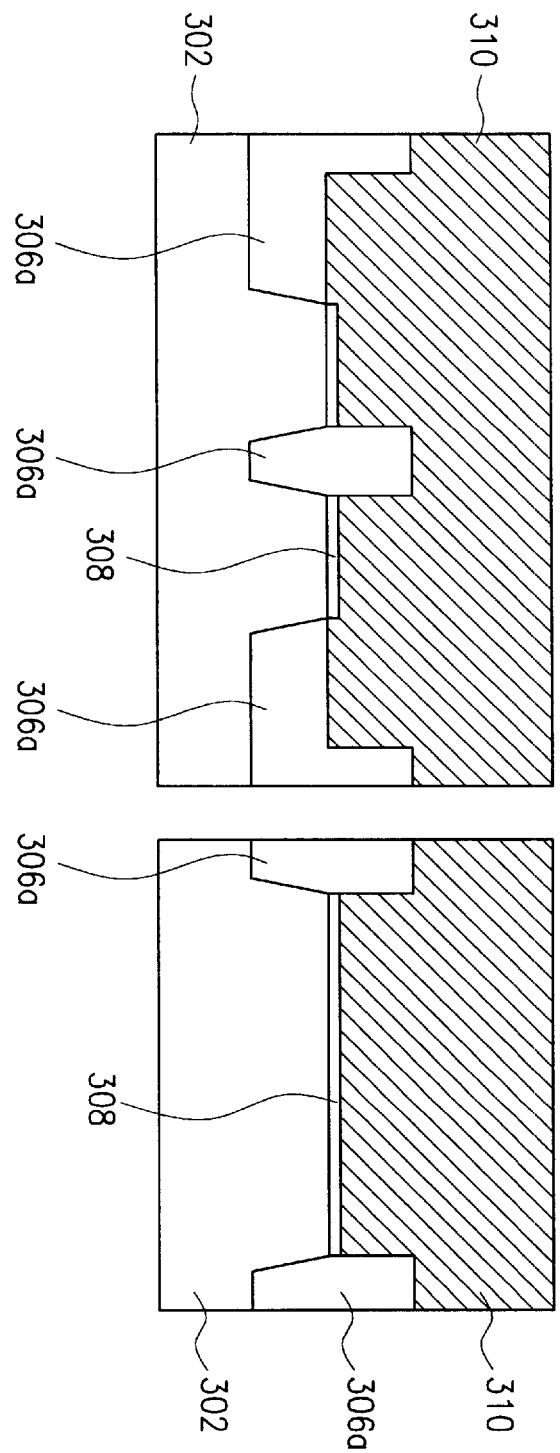

As illustrated in FIG. 3c, a gate insulation film 308 is formed on the exposed semiconductor substrate 302. A conductive material 310 for the gate electrode is stacked to completely fill up a stepped portion of the device isolation insulation film 306a.

Figure 3D:
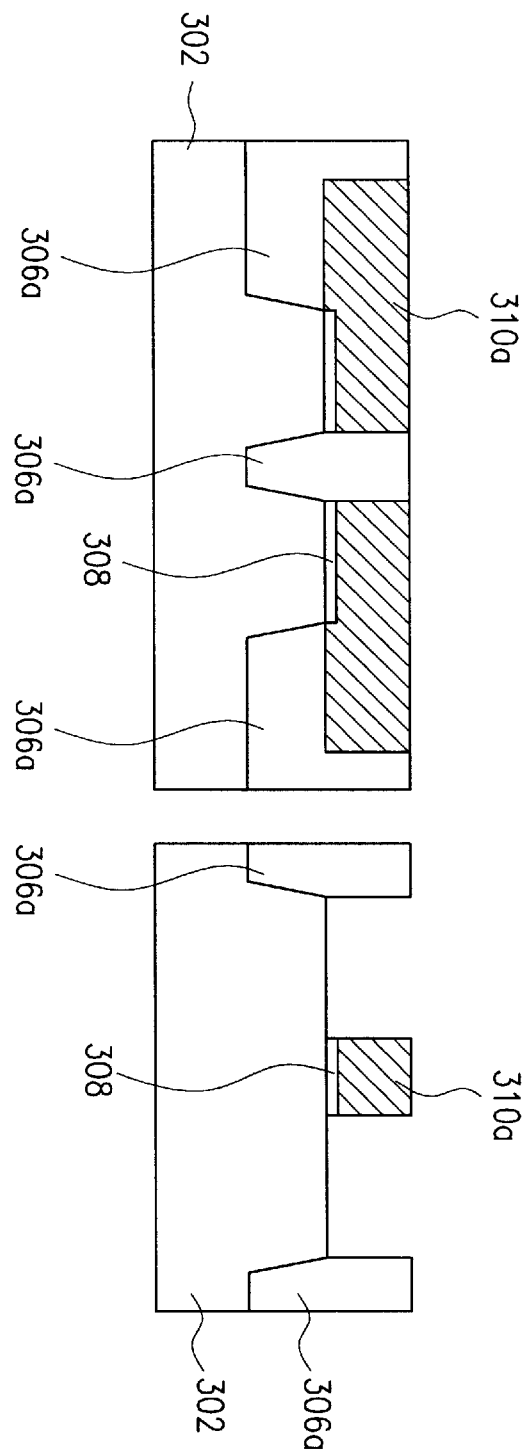

As shown in FIG. 3d, the upper portion of the conductive material 310 for the gate electrode is removed by a predetermined thickness according to an etch back process using an etching gas or a chemical mechanical polishing (CMP) process, thereby exposing the upper portion of the device isolation insulation film 306a.

Thereafter, the conductive material 310 for the gate electrode is partially removed according to an etching process using the gate electrode mask 206 as shown in FIG. 2, thereby forming the gate electrode 310a.

Here, the gate electrode 310a is self aligned with the device isolation insulation film 306a. That is, it is not necessary to partially overlap the gate electrode with the device isolation insulation film as in the conventional method. Accordingly, a size of the MOSFET is minimized.

Figure 3E:
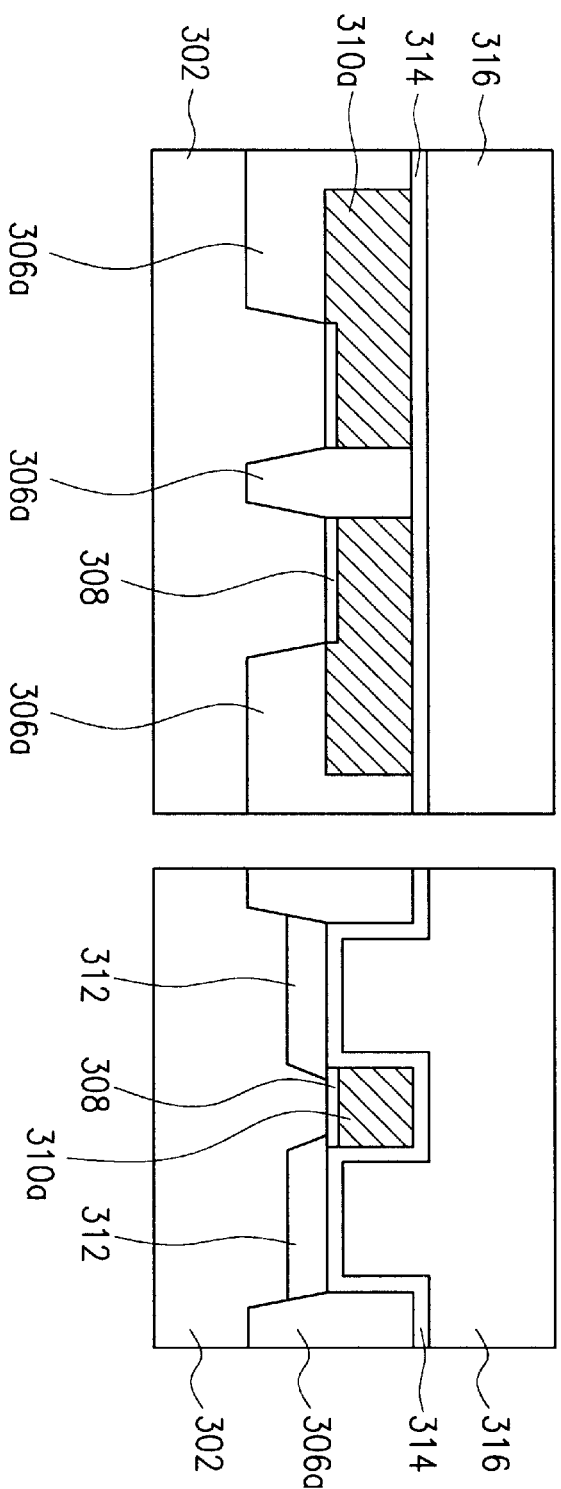

As depicted in FIG. 3e, source/drain electrodes 312 are formed on the exposed semiconductor substrate 302 according to an impurity diffusion process doping arsenic, phosphor or the like.

An etch barrier film 314 is formed on the whole surface of the semiconductor substrate 302 where the device isolation insulation film 306a, the gate electrode 310a and the source/drain electrodes 312 are formed to have a stepped portion. An interlayer insulation film 316 is evenly formed on the etch barrier film 314. Preferably, the etch barrier film 314 consists of a nitride film, and the interlayer insulation film 316 consists of an oxide film.

Figure 3F:
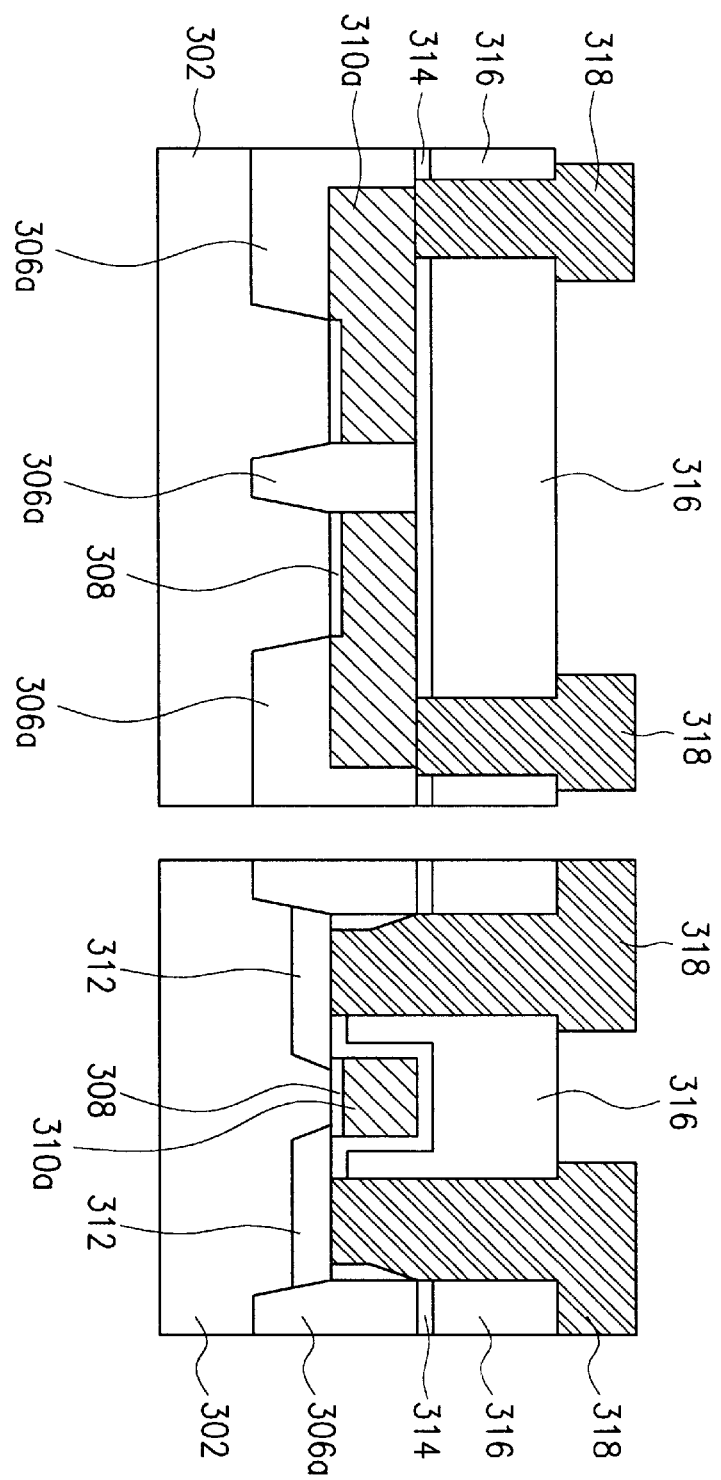

A contact is formed on the gate electrode 310a and the source/drain electrodes 312 according to an etching process using the contact mask 208 as shown in FIG. 2. The contact is filled with a conductive material, thereby forming an interconnection 318. As illustrated in FIG. 3f, formation of the MOSFET is finished.

In accordance with the first embodiment of the present invention, when forming the MOSFET, the gate electrode is self aligned with the device isolation insulation film, differently from the conventional method of overlapping the gate electrode with the device isolation insulation film. As a result, a size of the MOSFET is minimized.

For example, when it is presumed that a MOS transistor is formed according to a design rule of 0.18 $\mu$m, in the conventional method, a minimum interval between the gate electrodes is 0.18 $\mu$m, an overlapped interval between the gate electrode and the device isolation insulation film is about 0.06 $\mu$m in consideration of the misalignment and CD variation, and thus an interval between the adjacent MOSFETs corresponds to a sum of the minimum interval between the gate electrodes and the overlapped interval at both MOSFETs (0.18 $\mu$m +0.6 $\mu$m*2=0.30 $\mu$m).

On the other hand, in accordance with the first embodiment of the present invention, the gate electrode is not overlapped with the device isolation insulation film, and thus the interval between the adjacent MOSFETs is the minimum interval between the device isolation insulation films, namely 0.18 μm.

As compared with the conventional method, the present invention can remarkably reduce the interval between the adjacent MOSFETs.

As discussed earlier, in accordance with the present invention, the gate electrode is self aligned with the device isolation insulation film, thereby achieving the high integration of the MOSFET.

The method for fabricating the semiconductor device in accordance with a second embodiment of the present invention will now be described with reference to FIGS. 4a to 4e.

FIGS. 4a to 4e are schematic cross-sectional views illustrating sequential steps of the method for fabricating the semiconductor device in accordance with the second embodiment of the present invention. Here, Figures at the left sides are cross-sectional views taken along line IIa—IIa in FIG. 2, and Figures at the right sides are cross-sectional views taken along line IIb—IIb in FIG. 2.

Figure 4A:
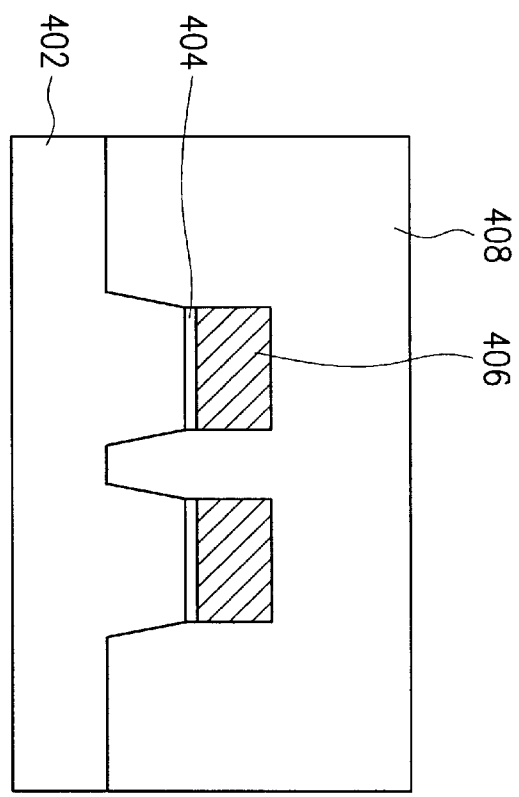
FIGS. 4a to 4e are schematic cross-sectional views illustrating sequential steps of a method for fabricating a semiconductor device in accordance with a second embodiment of the present invention, taken along lines IIa—IIa and IIb–IIb in FIG. 2 from the left side.
Figure 4A:
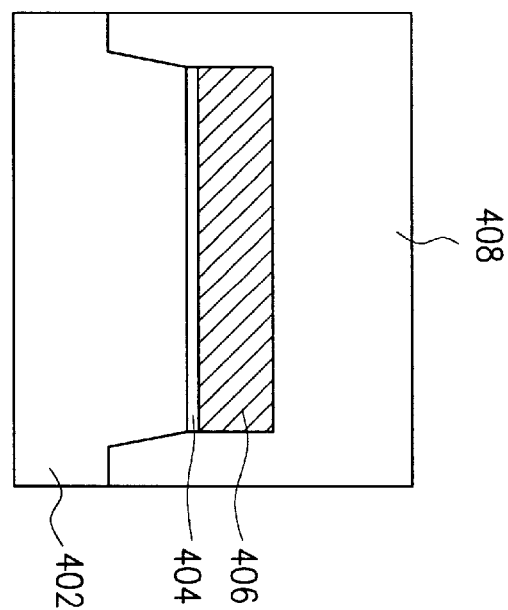

As depicted in FIG. 4a, a gate insulation material and a conductive material for a first gate electrode are sequentially formed on a semiconductor substrate 402.

The conductive material for the first gate electrode, the gate insulation material and the semiconductor substrate 402 are sequentially partially etched according to an etching process using the device isolation mask 202 as shown in FIG. 2, thereby forming a trench (for forming a device isolation insulation film).

At this time, the residual gate insulation material on the semiconductor substrate 402 becomes a gate insulation film 404, and the conductive material 406 for the first gate electrode becomes a part of the gate electrode.

Thereafter, a device isolation insulation material 408 for forming the device isolation insulation film in a succeeding process is stacked to completely fill up the trench on the semiconductor substrate 402. Preferably, the device isolation insulation material 408 consists of an oxide film.

In this embodiment, the gate insulation material and the conductive material for the gate electrode are sequentially stacked on the semiconductor substrate 402, and then the trench is formed according to an etching process. However, an etch barrier film may be additionally formed on the conductive material for the gate electrode.

The whole surface of the device isolation insulation material 408 is removed by a predetermined thickness according to an etch back process using an etching gas or CMP process, thereby exposing the upper portion of the residual conductive material 406 for the first gate electrode.

Figure 4B:
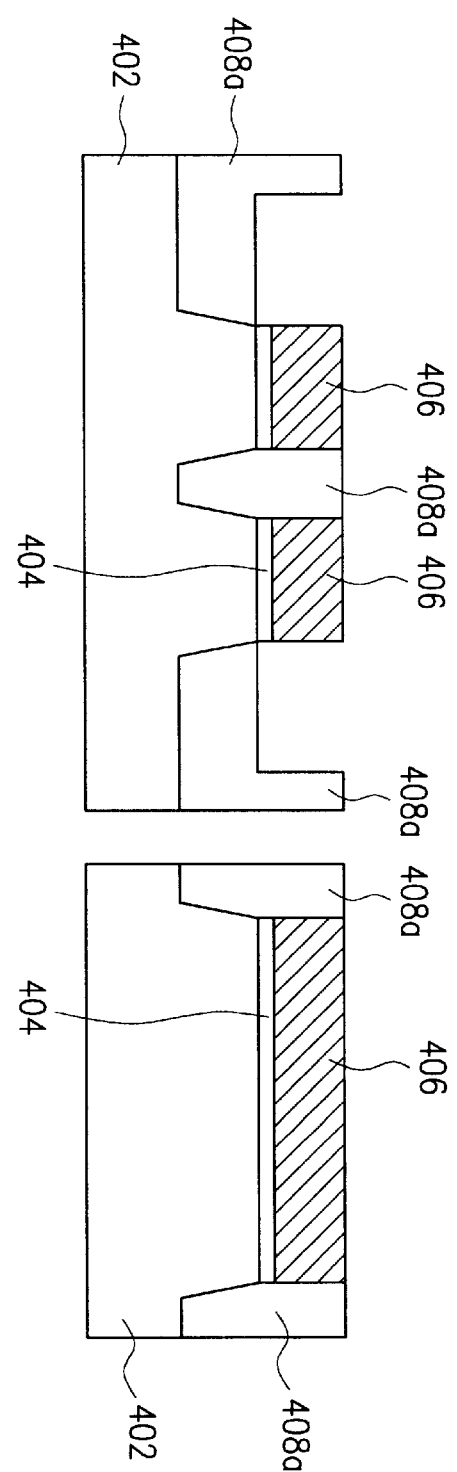

As illustrated in FIG. 4b, the device isolation insulation material 408 in a presumed field of the gate electrode line is partially etched according to an etching process using the gate formation mask 204 as shown in FIG. 2, thereby forming a groove. Therefore, the device isolation insulation film 408a is formed. As shown at the left side of FIG. 4b, the conductive material 406 for the first gate electrode remains in a presumed region of the gate electrode.

Figure 4C:
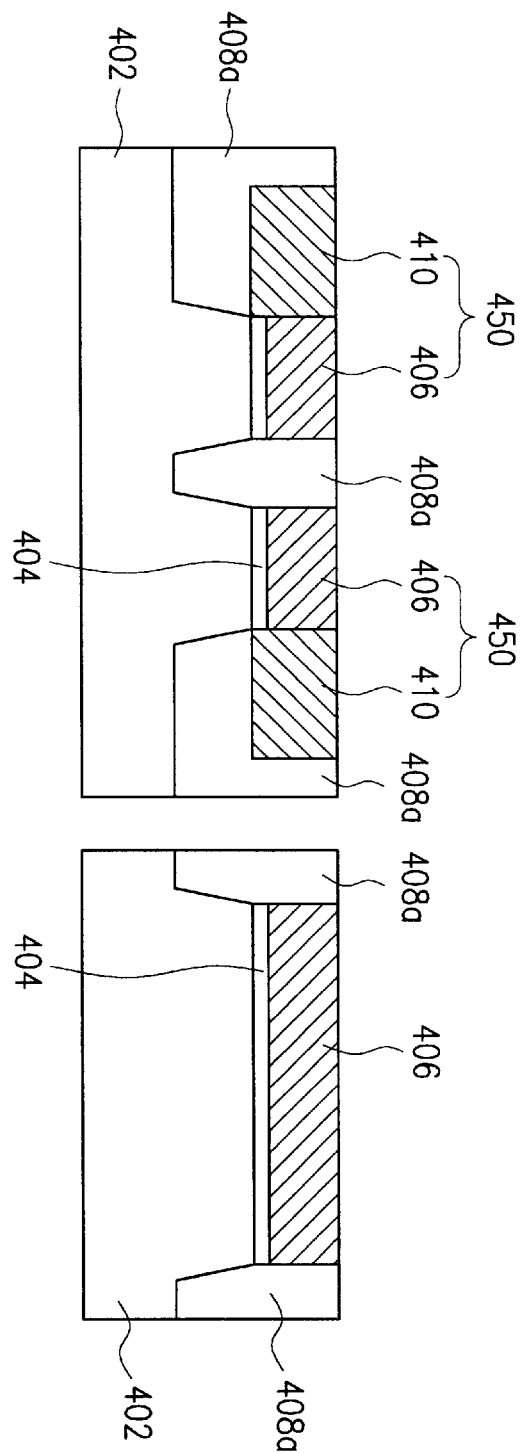

Referring to FIG. 4c, a conductive material 410 for a second gate electrode is formed to fill up the groove on the device isolation insulation film 408a. The conductive material 410 for the second gate electrode is evenly removed according to an etch back process using an etching gas or CMP process, thereby exposing the upper portions of the conductive material 406 for the first gate electrode and the device isolation insulation film 408a.

Here, the conductive material 406 for the first gate electrode and the conductive material 410 for the second gate electrode remaining in the groove compose the gate electrode 450.

Figure 4D:
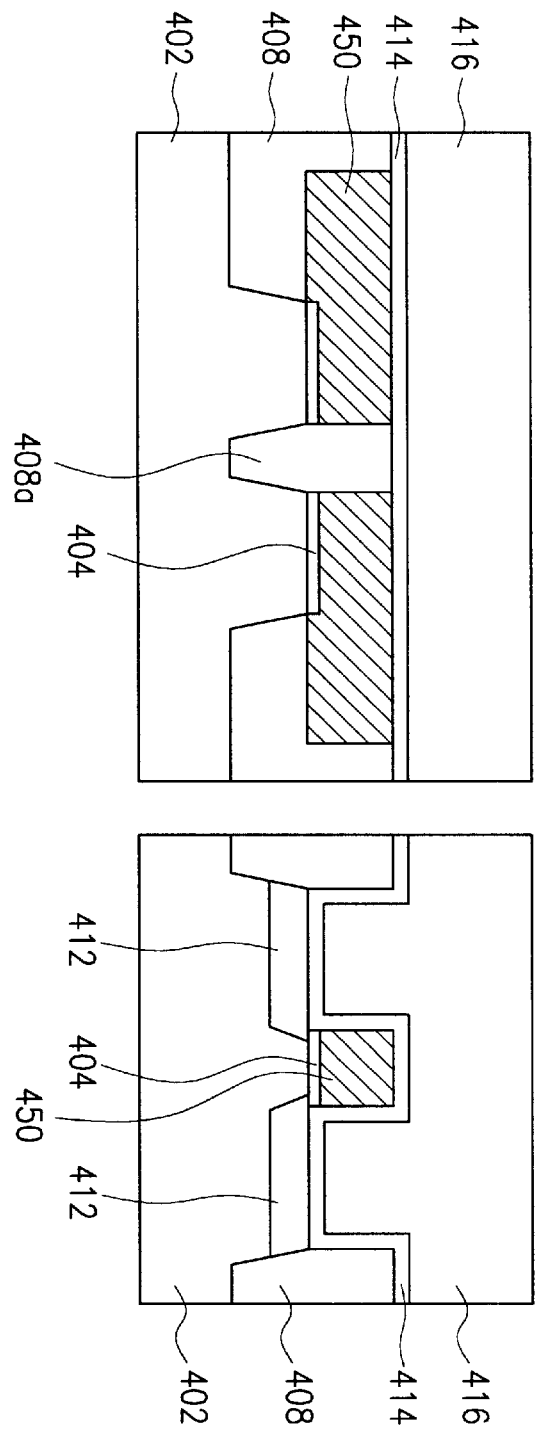

As illustrated in FIG. 4d, the upper portion of the gate insulation film 404 is partially exposed by removing a part of the conductive material for the gate electrode according to an etching process using the gate electrode mask 206 as shown in FIG. 2, thereby forming the gate electrode 450. Thereafter, source/drain electrodes 412 are formed on the exposed semiconductor substrate 402 according to an impurity diffusion process doping arsenic, phosphor or the like.

An etch barrier film 414 is formed on the whole surface of the semiconductor substrate 402 where the device isolation insulation film 408a, the gate electrode 450 and the source/drain electrodes 412 are formed to have a stepped portion. An interlayer insulation film 416 is evenly formed on the etch barrier film 414. Preferably, the etch barrier film 414 consists of a nitride film, and the interlayer insulation film 416 consists of an oxide film.

A contact is formed on the gate electrode 450 and the source/drain electrodes 412 according to an etching process using the contact mask 208 as shown in FIG. 2.

Figure 4E:
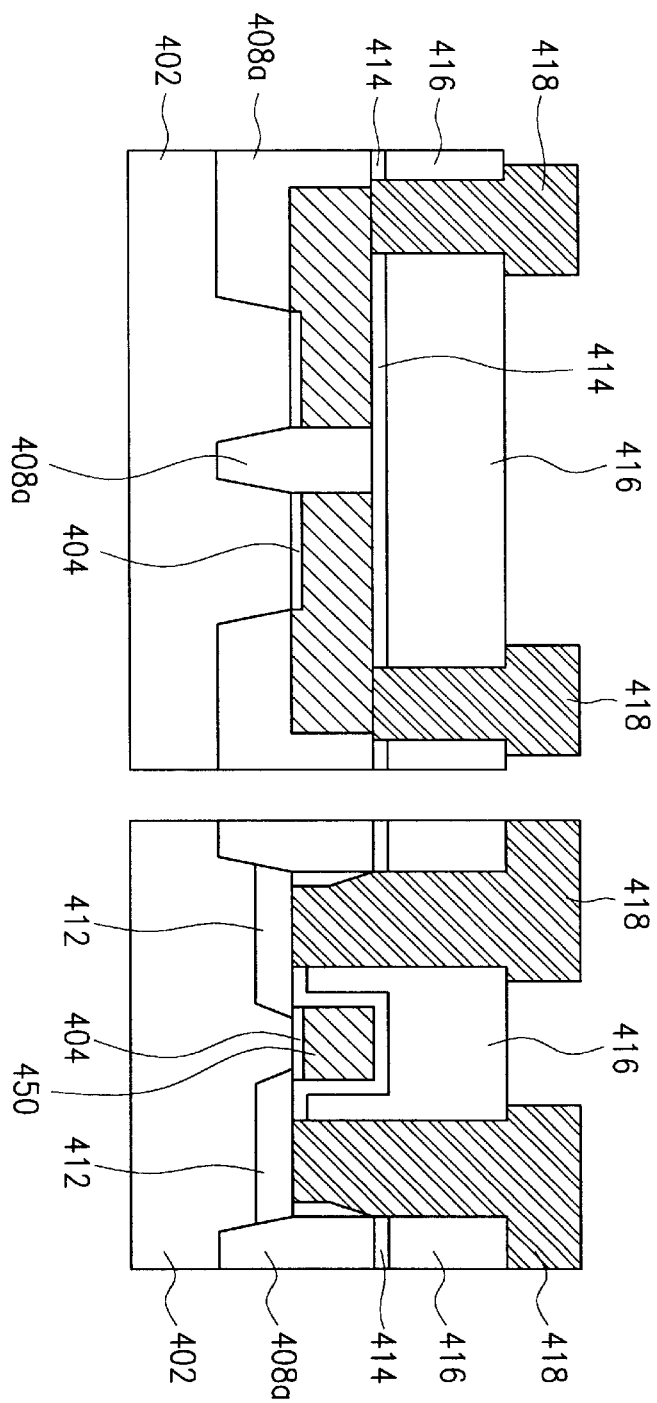

As depicted in FIG. 4e, the contact is filled with a conductive material, thereby forming an interconnection 418. Accordingly, formation of the MOSFET is finished.

As discussed earlier, the method for fabricating the semiconductor device in accordance with the present invention has the following advantage:

The gate electrode is self aligned with the device isolation insulation film, and thus is not overlapped with the device isolation insulation film, differently from the conventional method for forming the MOSFET by partially overlapping the gate electrode with the device isolation insulation film in consideration of the misalignment and CD variation in the mask process. As a result, a size of the MOSFET is reduced, thereby efficiently achieving the high integration of the semiconductor device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a semiconductor device, comprising the steps of:

forming a trench mask layer on a semiconductor substrate;

forming a trench by partially etching the trench mask layer and the semiconductor substrate by employing a device isolation mask having a predetermined pattern, forming a device isolation insulation material; to fill up the trench;

etching back the device isolation insulation material to expose the upper portion of the trench mask layer;

forming a device isolation insulation film having a step by partially removing the device isolation insulation material on a field region whereon the gate electrode line is to be formed;

removing the trench mask layer to expose the semiconductor substrate;

forming a gate insulation film on the exposed semiconductor substrate;

forming a conductive material for a electrode on the device isolation insulation film having the step and the gate insulation film;

etching back the conductive material for gate electrode to expose the upper portion of the device isolation insulation film; and forming a gate electrode self aligned on the device isolation insulation film by removing the conductive material for the gate electrode.

2. The method according to claim 1, further comprising the steps of:

forming source/drain regions on the substrate regions at both sides of the gate electrode;

forming an etch barrier film on the gate electrode source/drain regions and the device isolation insulation film having the step;

forming a flat interlayer insulation film on the etch barrier film; and forming an interconnection, in contact with the gate electrode and source/drain regions on the interlayer insulation film.

3. The method according to claim 1, wherein the trench mask layer has a stacked structure of an oxide film and a nitride film.

4. The method according to claim 1, wherein the trench mask layer has a stacked structure of an oxide film and a silicon film.

* * * * *